(12) United States Patent
Kahlon et al.

(10) Patent No.: US 9,016,289 B2
(45) Date of Patent: Apr. 28, 2015

(54) SYSTEM AND METHOD FOR REDUCING PARTICLES AND MARKS ON WAFER SURFACE FOLLOWING REACTOR PROCESSING (75) Inventors: Satbir Kahlon, Livermore, CA (US); Glen Egami, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 821 days.

(21) Appl. No.: 13/305,464

(22) Filed: Nov. 28, 2011

(65) Prior Publication Data

US 2013/0133704 A1    May 30, 2013

(51) Int. Cl.
*H01L 21/67* (2006.01)

(52) U.S. Cl.
CPC ...... *H01L 21/67051* (2013.01); *H01L 21/6715* (2013.01)

(58) Field of Classification Search
CPC .................. H01L 21/67051; H01L 21/6715
USPC ........................................................... 134/83
See application file for complete search history.

(56) References Cited

U.S. PATENT DOCUMENTS

| 4,477,287 | A | 10/1984 | Kush et al. |
| 6,005,226 | A | 12/1999 | Aschner et al. |
| 6,050,446 | A * | 4/2000 | Lei et al. ....................... 220/819 |
| 6,142,017 | A | 11/2000 | Glassey |
| 6,221,204 | B1 * | 4/2001 | Liu .......................... 156/345.22 |
| 6,601,888 | B2 | 8/2003 | Mcilwraith et al. |
| 6,713,218 | B2 * | 3/2004 | Williams .......................... 430/5 |
| 6,764,386 | B2 | 7/2004 | Uziel |
| 7,456,930 | B2 | 11/2008 | Hazelton et al. |
| 7,472,786 | B2 | 1/2009 | Komori |
| 7,583,357 | B2 | 9/2009 | Donders et al. |
| 7,908,885 | B2 | 3/2011 | Devitt |
| 8,414,736 | B2 * | 4/2013 | Collins et al. ............ 156/345.48 |
| 2010/0263594 | A1 * | 10/2010 | Na et al. ....................... 118/725 |
| 2010/0300492 | A1 | 12/2010 | Magni et al. |
| 2013/0104940 | A1 * | 5/2013 | Nagamine et al. .............. 134/30 |
| 2014/0202501 | A1 * | 7/2014 | Mitsuyoshi et al. ............ 134/61 |

FOREIGN PATENT DOCUMENTS

WO    2008121561 A1    10/2008

* cited by examiner

*Primary Examiner* — Michael Barr
*Assistant Examiner* — Rita Adhlakha (57) ABSTRACT In one embodiment, a cleaning chamber is provided. The cleaning chamber has a base portion housing a first chuck, a top portion housing a plurality of cups, and a middle portion functioning as a lid for the base portion and a second chuck for the top portion. A rail couples the top portion and the middle portion, wherein the top portion is rigidly mounted to the rail, while the middle portion is slidably mounted to the rail. A support frame is rigidly mounted to the base portion, the support frame being pivotably affixed to the rail, wherein the rail maintains a vertical alignment between the top portion and the middle portion as the rail pivots.

17 Claims, 7 Drawing Sheets

SYSTEM AND METHOD FOR REDUCING PARTICLES AND MARKS ON WAFER SURFACE FOLLOWING REACTOR PROCESSING

BACKGROUND

Combinatorial processing of substrates performs processing on several regions of a substrate differently. The areas surrounding these regions are not processed as the regions are isolated during the processing. More than half of the substrate's surface may be unprocessed. It may be desirable to take the substrate processed in a combinatorial processing chamber and reinsert it into a conventional processing chamber to complete the formation of a structure or device for subsequent testing, screening or characterization. The unprocessed areas may preclude the substrate from being reinserted into a conventional substrate processing line, as the mask material, or any other contaminant, on the unprocessed areas remains. The mask material or other contaminants could contaminate a conventional processing chamber unless the material is removed from the unprocessed areas of the substrate. The additional processing afforded by reinserting the substrate into a conventional processing chamber may be required before a process from the combinatorial processing chamber and the resulting substrate can be characterized. Accordingly, if the substrate could be reinserted into the conventional processing line, the substrate could undergo further processing in order to evaluate the combinatorial processing.

SUMMARY

In exemplary embodiments, a multi-module cleaning chamber has the capability to clean a wafer after processing in a reactor. The wafer comes to the multi-module cleaning assembly for post-cleaning after processing in the reactor either to remove the reactor sleeve marks that are left behind upon their contact to the wafer or to clean interstitial areas before reinserting the wafer back into the production line. The top portion/lid of the multi-module cleaning chamber includes an in situ rinse (ISR) cleaning module. The base portion includes a spin-rinse-dry (SRD) cleaning module.

In some embodiments, the multi-module cleaning chamber has a base portion housing a first chuck, a top portion housing a plurality of cups, and a middle portion operable to be a lid for the base portion and a second chuck for the top portion. A rail couples the top portion and the middle portion, wherein the top portion is rigidly mounted to the rail, while the middle portion is slidably mounted to the rail. A support frame is rigidly mounted to the base portion, the support frame being pivotably affixed to the rail, wherein the rail maintains a vertical alignment between the top portion and the middle portion as the rail pivots.

BRIEF DESCRIPTION OF THE DRAWINGS

These and other advantages and aspects of the present invention will become apparent and more readily appreciated from the following detailed description of the invention taken in conjunction with the accompanying drawings, as follows.

DETAILED DESCRIPTION

The following description is provided as an enabling teaching of the invention and its best, currently known embodiments. Those skilled in the relevant art will recognize that many changes can be made to the embodiments described, while still obtaining the beneficial results. It will also be apparent that some of the desired benefits of the embodiments described can be obtained by selecting some of the features of the embodiments without utilizing other features. Accordingly, those who work in the art will recognize that many modifications and adaptations to the embodiments described are possible and may even be desirable in certain circumstances, and are a part of the invention. Thus, the following description is provided as illustrative of the principles of the embodiments of the invention and not in limitation thereof, since the scope of the invention is defined by the claims.

The embodiments describe a system for reducing particles and preventing horizontal movement of the bottom surface of the in situ rinse (ISR cups), which can be referred to as a top portion on a wafer surface within the multi-module cleaning chamber (ISR module/spin rinse dry (SRD) module). The embodiments eliminate the rubbing of this surface of the ISR cups on the wafer or substrate surface, where the rubbing is caused by horizontal movement of the ISR cup assembly during loading/unloading of the wafer, while the ISR chuck/SRD lid, which may be referred to as a middle portion, remains stationary. The ISR-chuck/SRD-lid is slidably mounted to a rail, and the rail is rigidly mounted to the ISR cup assembly. Thus, the ISR chuck can slide up and down with respect to the ISR cup assembly, which has no vertical movement. The ISR chuck also moves vertically with respect to the SRD module (base portion), which is stationary. The rail is pivotably mounted to a support frame, which rigidly supports the SRD. In some embodiments, the pivot is affixed to an upper portion of the rail and the support frame, which is proximate to the ISR cup assembly. The pivot enables draining of any fluid from the ISR chuck/SRD-lid. Thus, the ISR cup assembly and the ISR-chuck/SRD-lid can tilt together to drain chemistry through the pivotable mounting to the support frame, while the shared rail maintains the vertical alignment of the ISR cup assembly and eliminates independent horizontal movement of the ISR cup assembly and the ISR chuck/SRD-lid. The embodiments allow a linear movement in the direction along the rail axis and prevent any horizontal movements resulting in reduction of rubbing or abrasion of the surface of the substrate with the edge of the ISR cups.

Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to (i) test different materials, (ii) test different processing conditions within each unit process module, (iii) test different sequencing and integration of processing modules within an integrated processing tool, (iv) test different sequencing of processing tools in executing different process sequence integration flows, and combinations thereof in the manufacture of devices such as integrated circuits. In particular, there is a need to be able to test (i) more than one material, (ii) more than one processing condition, (iii) more than one sequence of processing conditions, (iv) more than one process sequence integration flow, and combinations thereof, collectively known as "combinatorial process sequence integration," on a single monolithic substrate without the need for consuming the equivalent number of monolithic substrates per materials, processing conditions, sequences of processing conditions, sequences of processes, and combinations thereof. This can greatly improve both the speed and reduce the costs associated with the discovery, implementation, optimization, and qualification of materials, processes, and process integration sequences required for manufacturing.

High Productivity Combinatorial (HPC) processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

Systems and methods for HPC processing are described in U.S. Pat. No. 7,544,574, filed on Feb. 10, 2006; U.S. Pat. No. 7,824,935, filed on Jul. 2, 2008; U.S. Pat. No. 7,871,928, filed on May 4, 2009; U.S. Pat. No. 7,902,063, filed on Feb. 10, 2006; and U.S. Pat. No. 7,947,531, filed on Aug. 28, 2009 each of which is incorporated by reference herein. Systems and methods for HPC processing are further described in U.S. patent application Ser. No. 11/352,077, filed on Feb. 10, 2006; U.S. patent application Ser. No. 11/419,174, filed on May 18, 2006; U.S. patent application Ser. No. 11/674,132, filed on Feb. 12, 2007; and U.S. patent application Ser. No. 11/674,137, filed on Feb. 12, 2007. The aforementioned patent applications claim priority from provisional patent application 60/725,186 filed Oct. 11, 2005. Each of the aforementioned patent applications and the provisional patent application are incorporated by reference herein.

Figure 1:
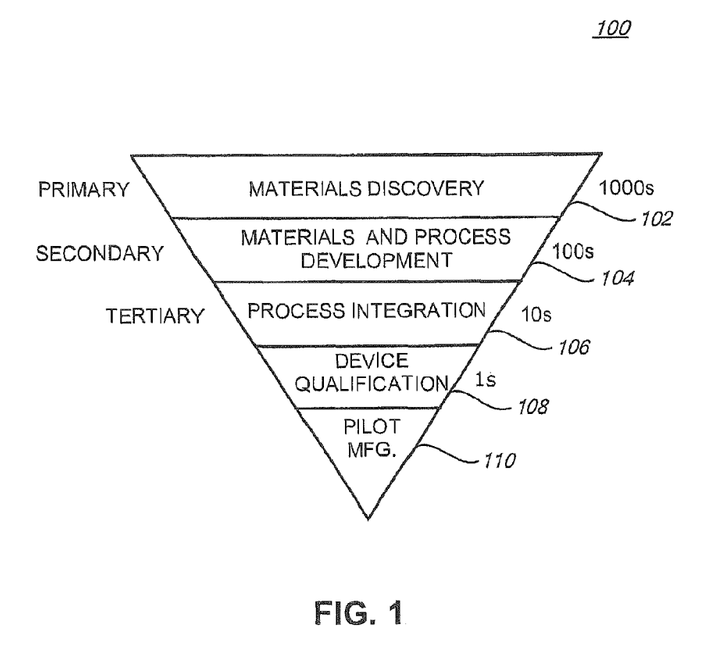
FIG. 1 illustrates a simplified schematic diagram providing an overview of the High-Productivity Combinatorial (HPC) screening process for use in evaluating materials, unit processes, and process sequences for the manufacturing of semiconductor devices in accordance with exemplary embodiments.

FIG. 1 illustrates a schematic diagram 100 for implementing combinatorial processing and evaluation using primary, secondary, and tertiary screening. The schematic diagram 100 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage 102. Materials discovery stage 102 is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage 104. Evaluation of the materials is performed using metrology tools such as electronic testers and imaging tools (e.g., microscopes).

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106 where tens of materials and/or processes and combinations are evaluated. The tertiary screen or process integration stage 106 may focus on integrating the selected processes and materials with other processes and materials.

The most promising materials and processes from the tertiary screen are advanced to device qualification 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 110.

The schematic diagram 100 is an example of various techniques that may be used to evaluate and select materials and processes for the development of new materials and processes. The descriptions of primary, secondary, etc. screening and the various stages 102-110 are arbitrary and the stages may overlap, occur out of sequence, be described and be performed in many other ways.

This application benefits from High Productivity Combinatorial (HPC) techniques described in U.S. patent application Ser. No. 11/674,137, filed on Feb. 12, 2007, which is hereby incorporated by reference in its entirety. Portions of the '137 application have been reproduced below to enhance the understanding of the embodiments disclosed herein. The embodiments disclosed enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as material characteristics of components utilized within the unit manufacturing operations. Rather than only considering a series of local optimums, i.e., where the best conditions and materials for each manufacturing unit operation is considered in isolation, the embodiments described below consider effects of interactions introduced due to the multitude of processing operations that are performed and the order in which such multitude of processing operations are performed when fabricating a device. A global optimum sequence order is therefore derived, and as part of this derivation, the unit processes, unit process parameters, and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform throughout each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameters (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
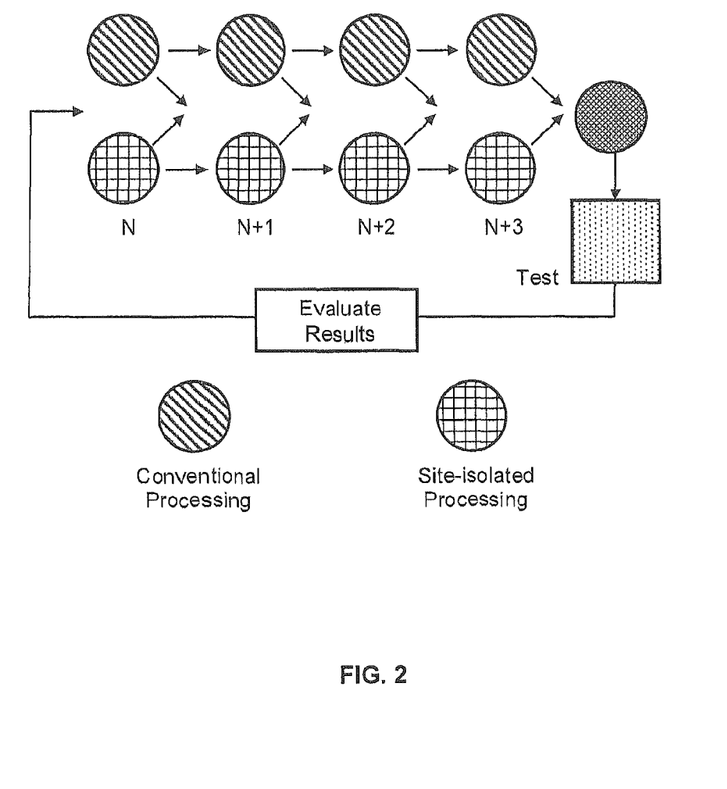
FIG. 2 illustrates a flowchart of a general methodology for combinatorial process sequence integration that includes site-isolated processing and/or conventional processing in accordance with exemplary embodiments.

FIG. 2 is a simplified schematic diagram illustrating a general methodology for combinatorial process sequence integration that includes site isolated processing and/or conventional processing in accordance with some embodiments of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g., from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments described herein perform the processing locally in a conventional manner, i.e., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
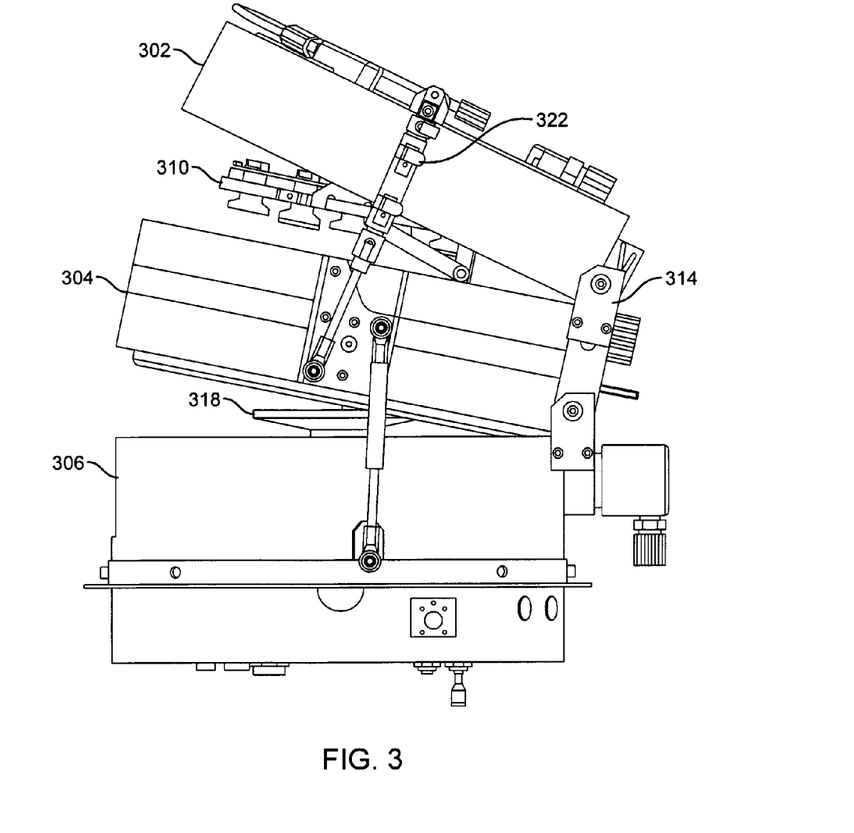
FIG. 3 illustrates a simplified schematic diagram of a perspective view of the cleaning chamber with top cleaning module and the bottom cleaning module in an open position in accordance with exemplary embodiments.

FIG. 3 is a simplified schematic diagram illustrating a perspective view of a multi-module cleaning chamber with the top cleaning module and the bottom cleaning module in an open position in accordance with some embodiments of the invention. Lid 302 is in an open position through the support of hinge 314 and support cylinder 322. In the open position, the top cleaning module enables access for a substrate to be delivered so that support assembly 310 may couple to the substrate. In one embodiment, an end effector may be used to transport a substrate to and from the cleaning module, as well as between the top and bottom cleaning modules. Mid portion 304 is also illustrated as opened thereby enabling access to the bottom cleaning module 306. It should be appreciated that mid portion 304 functions as a base for the top cleaning module and a lid for the bottom cleaning module. Hinge 314 and support cylinder 322 provide the support and force necessary for opening or lifting mid portion 304. When in an open position, bottom cleaning module enables access for a substrate to be placed on chuck 318. It should be appreciated that one exemplary operation may include isolating the combinatorially processed regions of a substrate in the top cleaning module and cleaning the external areas of the substrate in the top cleaning module. After the cleaning operation in the top cleaning module the substrate is transported to the bottom cleaning module 306 for a spin, rinse, and dry (SRD) operation.

Figure 4:
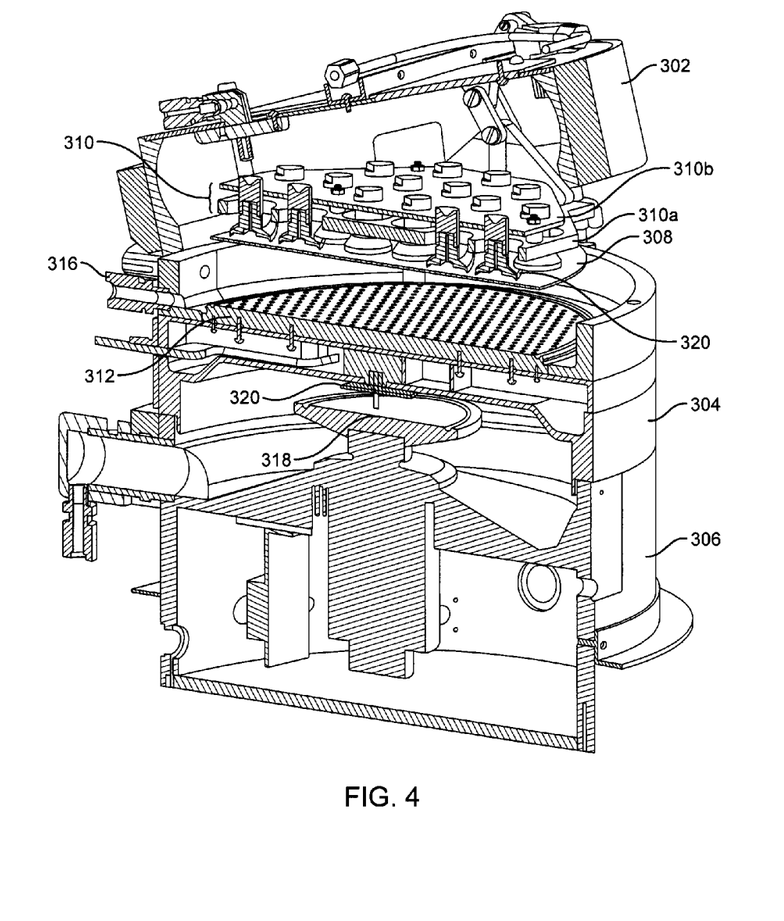
FIG. 4 illustrates a simplified schematic diagram of a perspective view of the bottom cleaning module in accordance with exemplary embodiments.

FIG. 4 is a simplified schematic diagram illustrating a cross-sectional view of a multi-module cleaning chamber in accordance with one embodiment of the invention. Lid 302 houses or encompasses top and side surfaces of support assembly 310 when the lid is in a closed position. Support assembly 310 includes top plate 310b disposed over bottom plate 310a. Top plate 310b has a plurality of holes disposed thereon. Cups 330 are disposed through the plurality of holes within top plate 310b and a plurality of holes in top plate 310a that are substantially aligned with corresponding holes of the bottom plate. Substrate 308 is supported through cups 330. When lid 302 is in a closed position, a bottom surface of substrate 308 will rest against chuck 312. Fitting 316 enables fluid flow to exit from the top cleaning module in one embodiment. As mentioned above, mid portion 304 functions as a bottom portion to the top cleaning module and a top portion of the bottom cleaning module. The bottom cleaning module, which includes base 306, functions as an SRD module in one embodiment. The SRD module includes chuck 318 that supports and rotates a substrate during a cleaning operation and a showerhead 320 disposed on a bottom surface of mid portion 304. The cleaning of the substrate in the SRD module utilizes cleaning chemistries at elevated temperatures, where the cleaning chemistries are delivered to a surface of a substrate being processed. It should be appreciated that the cleaning chemistries may be delivered through a nozzle or other suitable delivery mechanism. The elevated temperatures cause condensation to form on the ambient temperature surface of the ceiling of the SRD module, which is a bottom surface of mid-portion 304. The condensation on the ceiling of the SRD may cause droplets to form which can fall onto the surface of the substrate and introduce contaminants.

The embodiments described herein establish an inert gas blanket just prior to, or concurrent with flowing the cleaning chemistry at the elevated temperature. The inert gas blanket can be introduced through showerhead 320, as well as alternative types of showerheads, where each of the showerheads directs the flow from an inlet along the ceiling of the SRD module. The inert gas may be nitrogen in one embodiment and provides an inert gas blanket or layer along the top surface of the SRD module that effectively prevents the formation of condensation on the top surface when the heated chemistries are introduced. It should be appreciated that alternative inert gases may be utilized in some embodiments. It should be further appreciated that the inert gases may be supplied through an inlet port of mid portion 304 that is in fluid communication with showerhead 320. In some embodiments, the inlet port is centrally located and extends through a top surface of the SRD module.

It should be appreciated that the material of construction for support assembly 310 and the cups 330, chuck 312, and chuck 318 may be any suitable material compatible with the cleaning fluids and operations, such as plastic, e.g., a fluoropolymer, in one embodiment. In one embodiment, the chucks, linkages, covers and plates described herein are composed of Ethylene chlorotrifluoroethylene (ECTFE), the tubing is composed of Perfluoroalkoxy (PFA) polytetrafluoroethylene (PTFE): the basins and lid are composed of PTFE, and the O-rings are composed of a Perfluorinated Elastomer. Further details on the multi-module cleaning assembly may be found in U.S. application Ser. No. 13/086,327 entitled "In-Situ Cleaning Assembly," filed on Apr. 13, 2011, which is incorporated by reference in its entirety herein.

Figure 5:
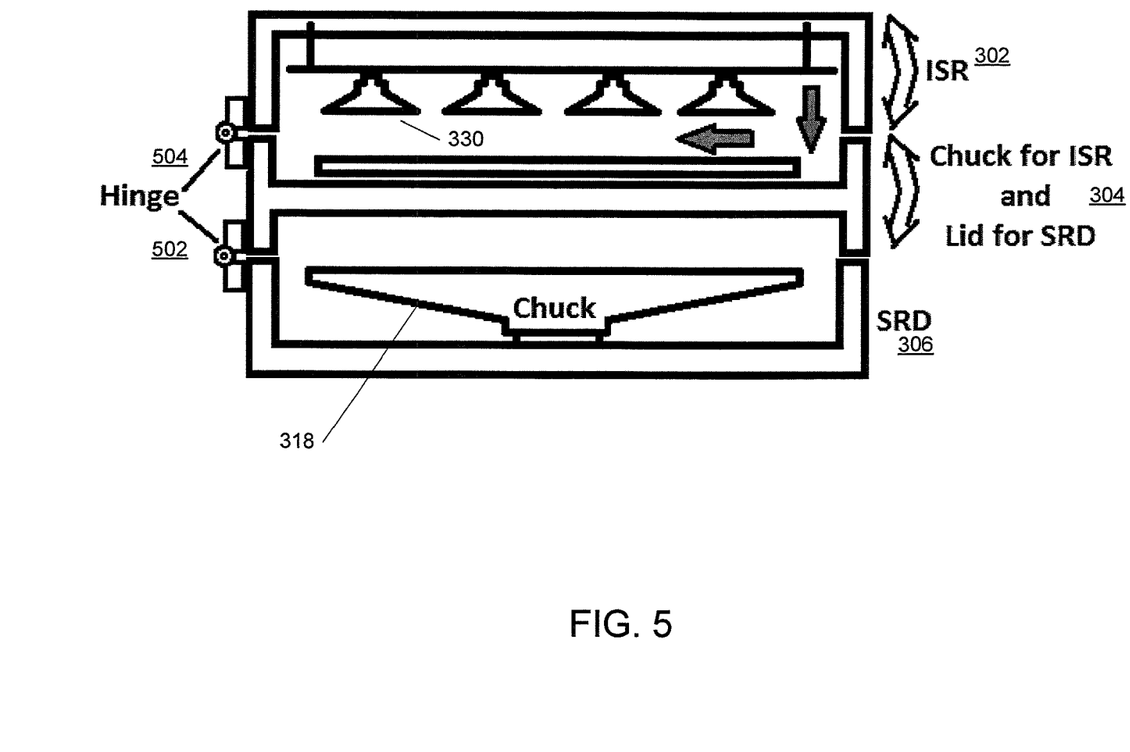
FIG. 5 illustrates a cross-sectional view of the multi-module cleaning chamber with the ISR chuck/SRD lid assembly and the ISR cup assembly hinged on one side of the chamber in accordance with some embodiments.

As illustrated in the cross-sectional view of FIG. 5, the multi-module cleaning chamber includes a base portion, a mid portion, and a top portion. The base portion is the SRD module 306, the top portion is the ISR cup assembly module 302, and the middle portion 304 acts as a lid for the SRD and a chuck for the ISR. During loading/unloading of the wafer into the ISR 302, the ISR-chuck/SRD-lid 304 is closed to the SRD 306 and then the ISR cup assembly 302 is closed or opened. FIG. 5 illustrates that the ISR-Chuck/SRD-lid 304 and the ISR cup assembly 302 are both hinged on one side (502, 504, respectively). In operation, both the ISR-Cup/SRD-chuck portion 304 and the ISR cup assembly 302 swing (i.e., angular motion) to open and close as these are hinged to one side. When the ISR cup assembly 302 either opens or closes to load or unload the wafer, the ISR cup assembly moves in an angular motion in a direction approximately perpendicular to the wafer surface. The angular motion of the ISR cup assembly 302 has both a horizontal and a vertical component. The vertical component of movement is in the direction perpendicular to the wafer surface, whereas the horizontal component is in the direction parallel to the wafer surface. When the ISR cup assembly 302 is still closing, the ISR cups 330 make contact with the wafer. Due to this horizontal movement, the cups 330 of the ISR cup assembly 302 rub on the wafer surface and leave behind residue that is difficult to remove.

Figure 6:
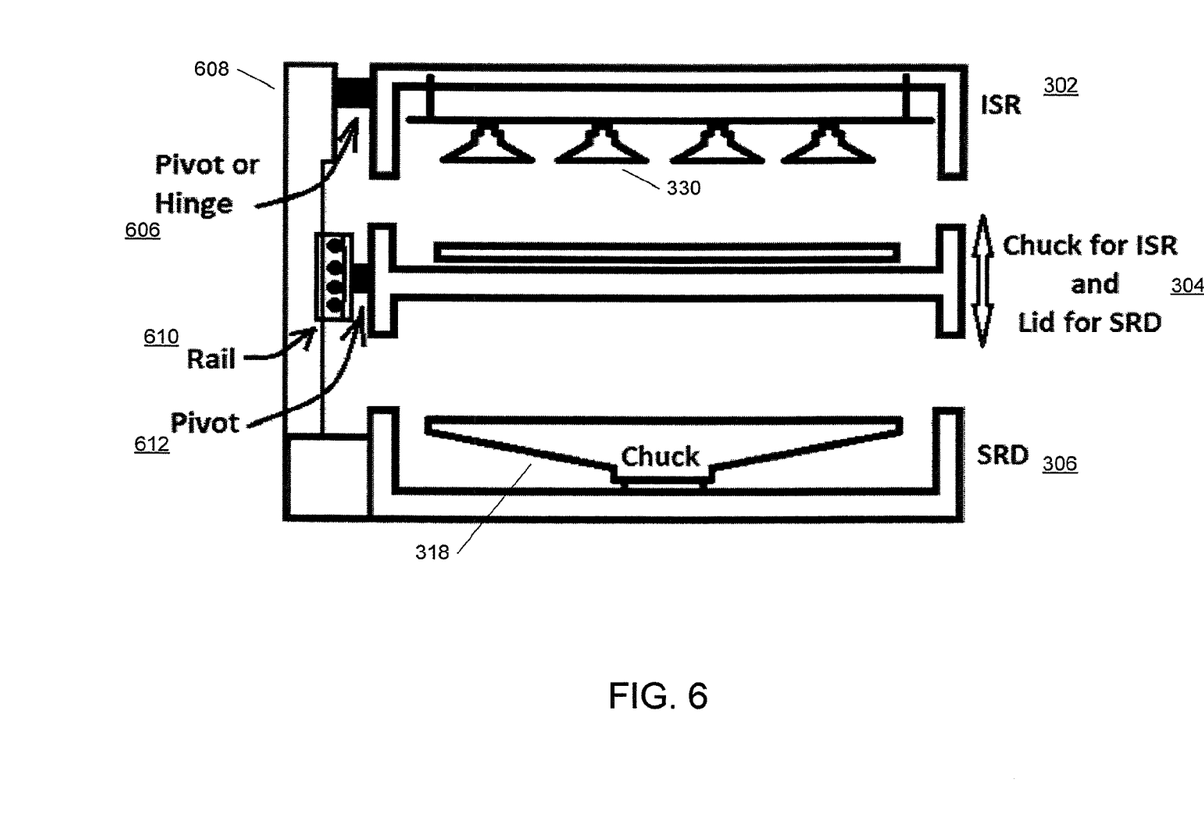
FIG. 6 illustrates a cross-sectional view of the multi-module cleaning chamber with the ISR cup assembly attached via a pivot to a fixed support and the ISR chuck/SRD lid assembly attached via a pivot to a rail in accordance with exemplary embodiments.

An exemplary embodiment for preventing the horizontal movement of ISR cups 330 is shown in FIG. 6. In some embodiments, the ISR cup assembly 302 is attached to a fixed support 608 via a pivot hinge 606 to allow the ISR cup assembly 302 to tilt in order to drain the cleaning chemistry. The ISR-chuck/SRD-lid portion 304 is mounted to a rail 610 that is attached via a pivot 612 to a fixed support 608, so the ISR-chuck/SRD-lid portion 304 can tilt along with ISR cup assembly 302. While the ISR assembly 302 is tilting in some embodiments, movement between the ISR cup assembly 302 and ISR-chuck/SRD-lid assembly 304 still could be produced in a direction horizontal to the wafer surface. This is due to the ISR cup assembly 302 and the ISR-chuck/SRD-lid assembly 306 pivoting at two different planes and closing together. As a result of any horizontal movement between the ISR cup assembly 302 and the ISR-chuck/SRD-lid assembly 304, the cups 330 may rub on the wafer surface and cause particles to form on the wafer.

Figure 7:
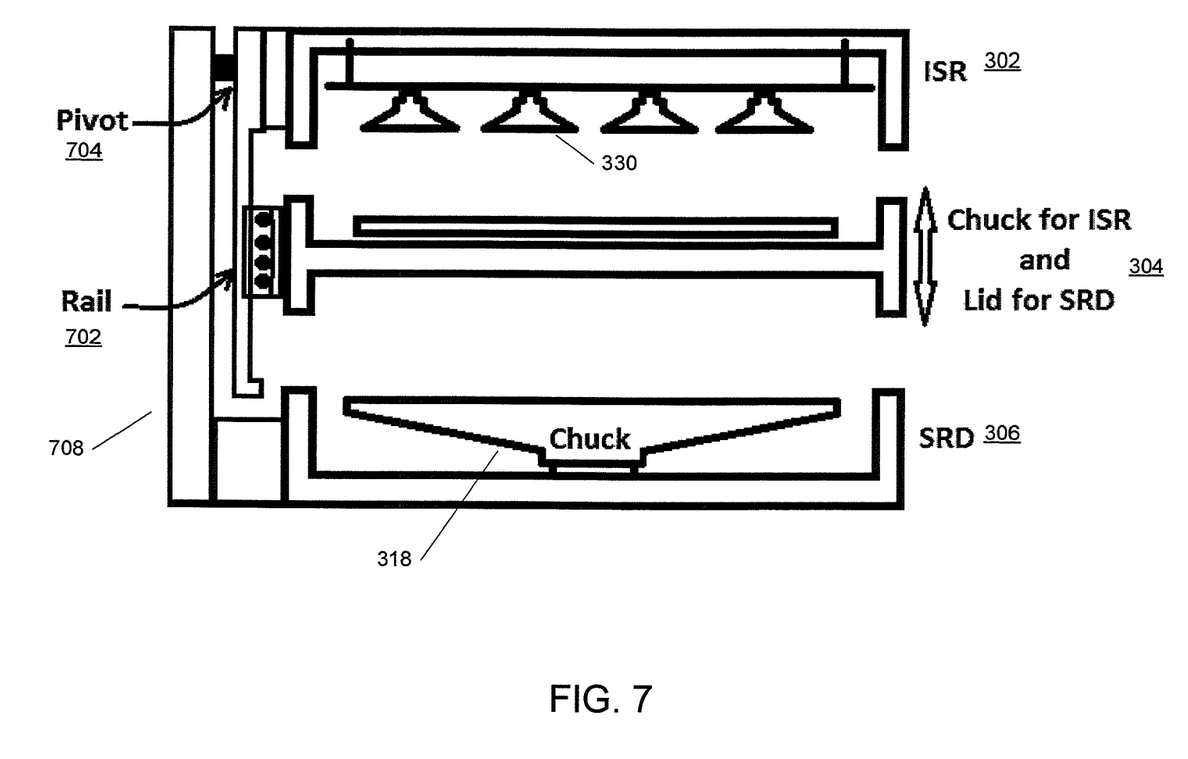
FIG. 7 illustrates a cross-sectional view of the multi-module cleaning chamber with the ISR cup assembly rigidly mounted to a rail and the ISR chuck/SRD lid assembly slideably mounted to the rail in accordance with some embodiments.

FIG. 7 illustrates a cross-sectional view of the multi-module cleaning chamber with the ISR cup assembly rigidly mounted to a rail and the ISR chuck/SRD lid assembly slideably mounted to the rail in accordance with some embodiments. In order to minimize defects due to cup marks, the rubbing of the ISR cups 330 on the wafer surface that is caused by horizontal movement during loading/unloading of the wafer is avoided by eliminating the horizontal movement. In order to prevent horizontal movement, the ISR-chuck/SRD-lid 304 is slideably mounted or coupled to a rail 702 and the ISR cup assembly 302 is rigidly mounted to the rail 702. This configuration enables the ISR-chuck/SRD-lid portion 304 slide up and down with respect to the ISR cup assembly 302. The ISR cup assembly 302 can be pivoted (via pivot 704) to a support 708 that is mounted with the SRD base 306 as shown in FIG. 7. The entire structure, including the ISR cup assembly 302 and the ISR-chuck/SRD-lid assembly 304, can be tilted together to drain the cleaning chemistry without creating any wobbles or horizontal movement, i.e., the vertical axis between the ISR cup assembly 302 and the ISR-chuck/SRD-lid assembly 304 is maintained. As the ISR-chuck/SRD-lid 304 is slideably mounted on a rail 702 and the rail 702 is rigidly mounted on the ISR cup assembly 302, the entire assembly can allow only a linear up and down movement in the direction along an axis of rail 702 which prevents any wobbles or horizontal movements. It should be appreciated that while support 708, rail 702, and pivot 704 are illustrated on one side of the multi module cleaning system, each of these components can be mirrored on an opposing side of the system in some embodiments in order to provide enhanced structural support. In some embodiments, a motor drives the ISR-chuck/SRD-lid 304 along the rail between the top of SRD module 306 and the bottom of ISR module 302. The motor driving the ISR-chuck/SRD-lid 304 between a top of the SRD module 306 and a bottom of the ISR cup assembly 302 may be a lead screw motor, worm gear motor, or any other suitable motor. It should be appreciated that reducing the horizontal movement of the ISR cups 330 on the wafer results in fewer defects. In some embodiments, the cups are constructed so that they do not touch the wafer surface. Examples of this cup design may be found in U.S. patent application Ser. No. 13/192,677, entitled "No-Contact Wet Processing Tool with Fluid Barrier" filed on Jul. 28, 2011 which is herein incorporated by reference.

The corresponding structures, materials, acts, and equivalents of all means plus function elements in any claims below are intended to include any structure, material, or acts for performing the function in combination with other claim elements as specifically claimed.

Those skilled in the art will appreciate that many modifications to the exemplary embodiment are possible without departing from the spirit and scope of the present invention. In addition, it is possible to use some of the features of the present invention without the corresponding use of the other features. Accordingly, the foregoing description of the exemplary embodiment is provided for the purpose of illustrating the principles of the present invention, and not in limitation thereof, since the scope of the present invention is defined solely by the appended claims.

What is claimed:
1. A chamber, comprising:
   a base portion housing a first chuck;
   a top portion comprising a plurality of cups;
   a middle portion operable to be a lid for the base portion and housing a second chuck for supporting a substrate;
   a rail coupling the top portion and the middle portion, wherein the top portion is rigidly mounted to the rail, while the middle portion is slideably mounted to the rail; and
   a support frame rigidly mounted to the base portion, the support frame pivotably affixed to the rail, wherein the rail maintains a vertical alignment between the top portion and the middle portion as the rail pivots.

2. The chamber of claim 1 wherein the middle portion is slideable on the rail between a bottom of the top portion and a top of the base portion.

3. The chamber of claim 1 wherein movement of the middle portion along the rail is controlled through a motor.

4. The chamber of claim 1 wherein the cups of the top portion are operable to seal against a surface of the substrate supported by the second chuck.

5. The chamber of claim 1 wherein an upper portion of the support frame is pivotably affixed to an upper portion of the rail.

6. The chamber of claim 1 wherein the top portion and the middle portion are tilted together to drain a cleaning chemistry in the top portion and the base portion.

7. The chamber of claim 1 wherein the top portion and the middle portion are tilted together wherein the vertical alignment between the top portion and the middle portion as the rail pivots prevents a relative horizontal movement between the top portion and the middle portion.

8. The chamber of claim 1 wherein the top portion further comprises a support assembly for the plurality of cups, the support assembly including a top plate and a bottom plate that are spaced apart.

9. The chamber of claim 8 wherein the top plate and the bottom plate of the support assembly comprises a plurality of openings defined therethrough, the plurality of cups extending through corresponding pairs of openings in the top and bottom plates, and wherein each of the plurality of cups is supported independently by the bottom plate.

10. A chamber, comprising:
    a base assembly housing a first chuck for supporting a substrate inserted into the base assembly for a first cleaning operation;
    a top assembly including a plurality of cups to isolate a plurality of regions on the surface of a substrate during cleaning of the surface of the substrate;
    a middle assembly housing a second chuck for supporting the substrate in the top assembly during a second cleaning operation;
    a rail coupling the top assembly and the middle assembly, wherein the top assembly is rigidly mounted to the rail and the middle assembly is slideably mounted to the rail; and
    a frame structure rigidly mounted to the base assembly, the frame structure affixed to the rail at an upper end of the frame structure, the rail maintaining a vertical alignment between the top assembly and the middle assembly during movement of either the top assembly or the middle assembly.

11. The chamber of claim 10 wherein the middle assembly is a lid for the base assembly.

12. The chamber of claim 10 wherein the frame structure is affixed to the rail by a one of a pivot or a hinge.

13. The chamber of claim 12 wherein a cleaning chemistry is drained simultaneously from a base of the middle assembly when the rail pivots to tilt both the top assembly and the middle assembly.

14. The chamber of claim 10 wherein the middle assembly slides on the rail between a bottom of the top assembly and a top of the bottom assembly.

15. The chamber of claim 10 wherein movement of the middle assembly along the rail is controlled through a motor.

16. The chamber of claim 10 wherein the plurality of cups of the top assembly are operable to seal against a surface of the substrate when supported by the second chuck.

17. The chamber of claim 10 wherein an upper portion of the frame structure is pivotably affixed to an upper portion of the rail.

\* \* \* \* \*